United States Patent
Kato (10) Patent No.: US 11,757,429 B2
(45) Date of Patent: Sep. 12, 2023

(54) HYBRID FILTER DEVICE AND MULTIPLEXER

(71) Applicant: Murata Manufacturing Co., Ltd., Kyoto (JP)

(72) Inventor: Masanori Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 91 days.

(21) Appl. No.: 16/828,034

(22) Filed: Mar. 24, 2020

(65) Prior Publication Data

US 2020/0228094 A1 Jul. 16, 2020

Related U.S. Application Data

(63) Continuation of application No. PCT/JP2018/031322, filed on Aug. 24, 2018.

(30) Foreign Application Priority Data

Sep. 29, 2017 (JP) ................. 2017-192101

(51) Int. Cl.
*H03H 9/54* (2006.01)
*H03H 9/05* (2006.01)
*H03H 9/70* (2006.01)

(52) U.S. Cl.
CPC .......... *H03H 9/542* (2013.01); *H03H 9/0557* (2013.01); *H03H 9/70* (2013.01)

(58) Field of Classification Search
CPC ......... H03H 9/542; H03H 9/0557; H03H 9/70
See application file for complete search history.

(56) References Cited

U.S. PATENT DOCUMENTS

| 6,525,624 B1 | 2/2003 | Hikita et al. |
| 8,849,362 B1 | 9/2014 | Saji et al. |
| 10,158,341 B2 | 12/2018 | Nosaka |
| 10,340,883 B2 | 7/2019 | Sugaya |
| 2005/0093171 A1 | 5/2005 | Sugiura |

(Continued)

FOREIGN PATENT DOCUMENTS

| CN | 104662798 A | 5/2015 |
| JP | H09321573 A | 12/1997 |

(Continued)

OTHER PUBLICATIONS

International Search Report for International Application No. PCT/JP2018/031322, dated Nov. 13, 2018.

(Continued)

*Primary Examiner* — Samuel S Outten
(74) *Attorney, Agent, or Firm* — Pearne & Gordon LLP (57) ABSTRACT

A hybrid filter device (1) includes an acoustic wave device (AD) that includes an acoustic wave resonator and a passive device (PD) that includes an inductor element or an inductor element and a capacitance element. At least one of the acoustic wave device (AD) and the passive device (PD) is mounted on a substrate (20) of the hybrid filter device (1) and the acoustic wave device (AD) and the passive device (PD) are electrically connected to each other. The acoustic wave device (AD) overlaps the passive device (PD) when the hybrid filter device (1) is viewed in a direction perpendicular to one main surface (20a) of the substrate (20).

16 Claims, 7 Drawing Sheets

(56) References Cited

U.S. PATENT DOCUMENTS

| | | | |
|---|---|---|---|
| 2005/0230812 A1* | 10/2005 | Przadka | H03H 9/0557 257/698 |
| 2007/0090521 A1 | 4/2007 | Imaizumi et al. | |
| 2014/0333391 A1* | 11/2014 | Tsuda | H03H 9/542 333/195 |
| 2015/0188512 A1 | 7/2015 | Michigami | |
| 2016/0322956 A1 | 11/2016 | Takeuchi et al. | |
| 2017/0244431 A1 | 8/2017 | Araki | |
| 2020/0287523 A1* | 9/2020 | Urata | H03H 9/25 |

FOREIGN PATENT DOCUMENTS

| | | |
|---|---|---|
| JP | 2001069031 A | 3/2001 |
| JP | 2001189417 A | 7/2001 |
| JP | 2002134689 A | 5/2002 |
| JP | 2005057577 A | 3/2005 |
| JP | 2005235808 A | 9/2005 |
| JP | 2006060563 A | 3/2006 |
| JP | 2008072748 A | 3/2008 |
| JP | 2015111747 A | 6/2015 |
| JP | 2017152881 A | 8/2017 |
| WO | 2005024947 A1 | 3/2005 |
| WO | WO-2011104774 A1 * 9/2011 ............ H01L 23/66 |
| WO | 2014050219 A1 | 4/2014 |
| WO | 2015104882 A1 | 7/2015 |
| WO | 2016117676 A1 | 7/2016 |
| WO | 2017110993 A1 | 6/2017 |

OTHER PUBLICATIONS

Written Opinion for International Application No. PCT/JP2018/031322, dated Nov. 13, 2018.

* cited by examiner

HYBRID FILTER DEVICE AND MULTIPLEXER

This is a continuation of International Application No. PCT/JP2018/031322 filed on Aug. 24, 2018 which claims priority from Japanese Patent Application No. 2017-192101 filed on Sep. 29, 2017. The contents of these applications are incorporated herein by reference in their entireties.

BACKGROUND OF THE DISCLOSURE

Field of the Disclosure

The present disclosure relates to a hybrid filter device that includes an acoustic wave device including an acoustic wave resonator and a passive device including an inductor element or an inductor element and a capacitance element, and relates to a multiplexer.

Description of the Related Art

Heretofore, as a filter device provided in a mobile communication device and the like, a filter device is known that includes an acoustic wave resonator and an inductor element or a capacitance element (for example, refer to Patent Document 1). A filter device consisting of an acoustic wave device including an acoustic wave resonator and a passive device including an inductor element or an inductor element and a capacitance element is called a hybrid filter device. A hybrid filter device for example has a circuit configuration obtained by replacing a capacitance element of an LC circuit forming a low pass filter or a high pass filter with an acoustic wave resonator. A steep attenuation pole can be formed outside the pass band while widening the pass band by replacing the capacitance element of the LC circuit with an acoustic wave resonator. Thus, the frequency pass band width of the filter can be widened, and the steepness of the attenuation slope formed from the pass band to the stop band can be increased.

Patent Document 1: International Publication No. 2016/117676

BRIEF SUMMARY OF THE DISCLOSURE

With the increasing miniaturization and multiple band support of mobile communication devices and the like in recent years, there is demand for further miniaturization and higher integration of filter devices. However, for example, in a structure in which an acoustic wave device including an acoustic wave resonator and a passive device including an inductor element are arranged side by side on the same plane of a substrate, there is a problem in that the size of the hybrid filter device is increased.

The present disclosure was made in order to solve the above-described problem and it is an object thereof to reduce the size of a hybrid filter device.

In order to achieve the above object, a hybrid filter device according to an aspect of the present disclosure includes: a substrate; an acoustic wave device that includes an acoustic wave resonator; and a passive device that includes an inductor element or an inductor element and a capacitance element. At least one of the acoustic wave device and the passive device is mounted on the substrate. The acoustic wave device and the passive device are electrically connected to each other. The acoustic wave device overlaps the passive device when the hybrid filter device is viewed in a direction perpendicular to one main surface of the substrate.

With this configuration, the acoustic wave device and the passive device are arranged so as to overlap when viewed in a direction perpendicular to the one main surface of the substrate and consequently the hybrid filter device can be reduced in size compared with the case where the acoustic wave device and the passive device are arranged side by side in a direction along the one main surface of the substrate.

According to the present disclosure, a hybrid filter device or the like that includes an acoustic wave resonator and an inductor element can be reduced in size.

DETAILED DESCRIPTION OF THE DISCLOSURE

Embodiments of the present disclosure will be described in detail using the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure. Furthermore, in the drawings, configurations that are substantially the same as each other may be denoted by the same symbols and repeated description thereof may be omitted or simplified. In addition, in the following embodiments, "connected" is not limited to only the case of being directly connected and also includes the case of being electrically connected via another element or the like.

Hereafter, hybrid filter devices according to embodiments 1 to 6 will be described while referring to FIGS. 1 to 7. As a common feature, the hybrid filter devices according to embodiments 1 to 6 each include a substrate, an acoustic wave device including an acoustic wave resonator, and a passive device including an inductor element or an inductor element and a capacitance element. Furthermore, in embodiments 1 to 6, other common features are that at least one of the acoustic wave device and the passive device is mounted on the substrate, the acoustic wave device and the passive device are electrically connected to each other, and the acoustic wave device overlaps the passive device when the hybrid filter device is viewed in a direction perpendicular to one main surface of the substrate.

Embodiment 1

[1-1. Circuit Configuration of Hybrid Filter Device]

Figure 1:
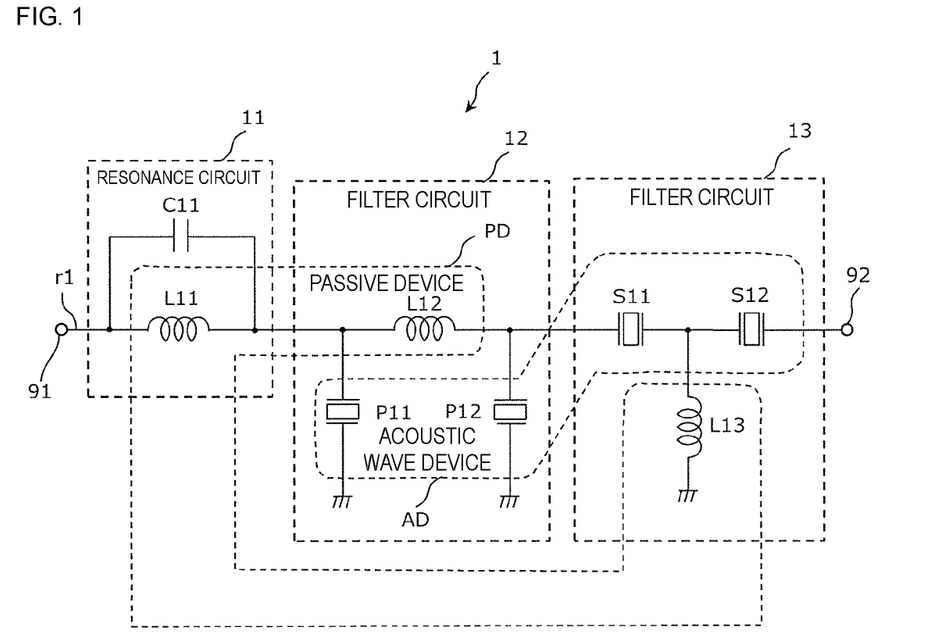
FIG. 1 is a circuit configuration diagram of a hybrid filter device according to embodiment 1.

First, the circuit configuration of a hybrid filter device 1 will be described. FIG. 1 is a circuit configuration diagram of the hybrid filter device 1 according to embodiment 1.

The hybrid filter device 1 illustrated in FIG. 1 includes a resonance circuit 11, filter circuits 12 and 13, and input/output terminals 91 and 92. The resonance circuit 11 and the filter circuits 12 and 13 are connected in series with each other in this order on a path r1 connecting the input/output terminal 91 and the input/output terminal 92.

The resonance circuit 11 includes an inductor element L11 and a capacitor element C11. The inductor element L11 is provided on the path r1 and is connected to the input/output terminal 91. The capacitor element C11 is connected in parallel with the inductor element L11. An LC parallel resonance circuit is formed by the capacitor element C11 and the inductor element L11 of resonance circuit 11.

The filter circuit 12 includes an inductor element L12, which is a series arm element, and acoustic wave resonators P11 and P12, which are parallel arm elements. Specifically, the inductor element L12 is provided on the path r1 and is serially connected to the inductor element L11. The acoustic wave resonator P11 is connected between a node between the inductor element L11 and the inductor element L12, and ground. The acoustic wave resonator P12 is connected between a node between the inductor element L12 and the filter circuit 13, and ground. A low pass filter (LPF) is formed by the inductor element L12 and the capacitance components of the acoustic wave resonators P11 and P12 of the filter circuit 12.

The filter circuit 13 includes acoustic wave resonators S11 and S12, which are series arm elements, and an inductor element L13, which is a parallel arm element. Specifically, the acoustic wave resonator S11 is provided on the path r1 and is serially connected to the inductor element L12. The acoustic wave resonator S12 is provided on the path r1 and is serially connected between the acoustic wave resonator S11 and the input/output terminal 92. The inductor element L13 is connected between a node between the acoustic wave resonator S11 and the acoustic wave resonator S12, and ground. A high pass filter (HPF) is formed by the inductor element L13 and the capacitance components of the acoustic wave resonators S11 and S12 of the filter circuit 13.

The acoustic wave resonators P11, P12, S11, and S12 are resonators that utilize acoustic waves, and for example are resonators that utilize bulk acoustic waves (BAW) or are film bulk acoustic resonators (FBAR). Not only surface acoustic waves but also boundary acoustic waves are included in the meaning of SAW.

The number of inductor elements and the number of capacitor elements forming the resonance circuit 11 are not limited to one each and there may instead be two or more of each type of element. In addition, the number of inductor elements (number of serially connected elements) included in the filter circuit 12 is not limited to one and may be two or more, and the number of acoustic wave resonators (number of parallel connected elements) including in the filter circuit 12 is not limited to two and may be one or three or more. In addition, the number of inductors (number of parallel connected elements) included in the filter circuit 13 is not limited to one and may be two or more, and the number of acoustic wave resonators (number of serially connected elements) included in the filter circuit 13 may be one or three or more.

Next, the filter characteristic of the hybrid filter device 1 will be described. As described above, since the acoustic wave resonators P11, P12, S11, and S12 have capacitance components, an LPF is formed by the inductor element L12, which is a series arm element, and the acoustic wave resonators P11 and P12, which are parallel arm elements. Furthermore, a HPF is formed by the acoustic wave resonators S11 and S12, which are series arm elements, and the inductor element L13, which is a parallel arm element.

A pass band can be formed in the hybrid filter device 1 by the HPF and the LPF. For example, a single wide pass band can be formed by designing the hybrid filter device 1 so that the pass band of the HPF and the pass band of the LPF overlap and by forming the low side of the pass band using the HPF and forming the high side of the pass band using the LPF. Furthermore, the hybrid filter device 1 operates as a notch filter in which the bandpass characteristic is attenuated at the resonant frequencies or anti-resonant frequencies of the acoustic wave resonators P11, P12, S11, and S12 by appropriately adjusting the design parameters of the acoustic wave resonators P11, P12, S11, and S12. Thus, the acoustic wave resonators P11, P12, S11, and S12 attenuate part of the high-frequency side or the low-frequency side of the pass band formed by the HPF and the LPF.

The LC circuits forming the HPF and the LPF have characteristics that gently widen the pass band of the filter, and therefore the frequency pass band width is large. In addition, since the attenuation poles formed by the acoustic wave resonators P11, P12, S11, and S12 have high steepness, for example, the steepness of the attenuation slope formed from the pass band to a stop band can be made high by designing the acoustic wave resonators P11, P12, S11, and S12 so that the frequencies of the attenuation poles are positioned close to the pass band.

In this embodiment, the pass band of the hybrid filter device 1 is made to extend from 1427 MHz to 2200 MHz, which is a band extending from a middle low band (MLB) to a middle band (MB), by appropriately adjusting the design parameters of the acoustic wave resonators P11, P12, S11, and S12, the inductor elements L11 to L13, and the capacitor element C11. Furthermore, a stop band of the hybrid filter device 1 is from 2300 MHz to 2690 MHz, which is a high band (HB).

Thus, the hybrid filter device 1 can be realized that has a pass band that is a wide band from 1427 MHz to 2200 MHz and in which the attenuation slope on the high-frequency side has high steepness and that has a stop band that is on the high-frequency side of the pass band and is from 2300 MHz to 2690 MHz.

[1-2. Structure of Hybrid Filter Device]

The structure of the hybrid filter device 1 will be described while referring to FIGS. 1 to 2B.

As illustrated in FIG. 1, the acoustic wave resonators P11, P12, S11, and S12 are included in an acoustic wave device AD and the inductor elements L11, L12, and L13 are included in a passive device PD.

Figure 2A:
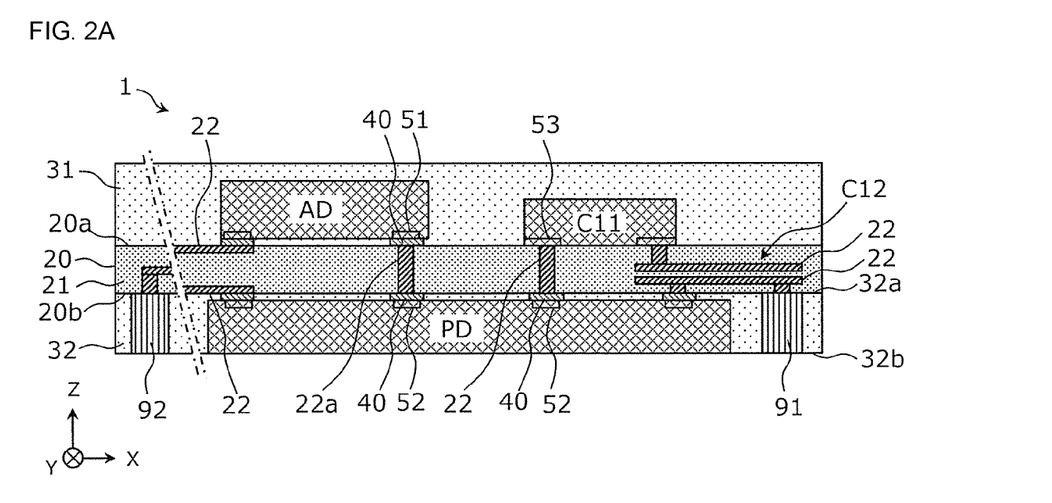
FIG. 2A is a sectional view of the hybrid filter device according to embodiment 1.

FIG. 2A is a sectional view of the hybrid filter device 1. FIG. 2B is a plan view of the hybrid filter device 1.

As illustrated in FIG. 2A, the hybrid filter device 1 includes: a substrate 20; the acoustic wave device AD and the capacitor element C11, which are mounted on one main surface 20a of the substrate 20; and the passive device PD, which is mounted on another main surface 20b of the substrate 20. The hybrid filter device 1 has a two-surface mounting structure in which electronic components are mounted on the one main surface 20a and the other main surface 20b of the substrate 20.

In addition, the hybrid filter device 1 includes a sealing resin layer 31 provided on the one main surface 20a of the substrate 20 so as to cover the acoustic wave device AD and the capacitor element C11 and a sealing resin layer 32 provided on the other main surface 20b of the substrate 20 so as to contact the side surfaces of the passive device PD. A thermally curable resin material such as an epoxy resin is used as the material of the sealing resin layers 31 and 32.

Among two main surfaces 32a and 32b of the sealing resin layer 32, the main surface 32b, which is on the opposite side from the main surface 32a that contacts the substrate 20, is a mounting surface used when mounting the hybrid filter device 1 on a mother substrate or the like. "Mounting surface" refers to the surface that faces a mother substrate when the hybrid filter device 1 is mounted on a mother substrate.

Hereafter, a direction that is perpendicular to the one main surface 20a will be referred to as a Z direction, a direction that extends along the one main surface 20a will be referred to as an X direction, and a direction that is perpendicular to both the X direction and the Z direction will be referred to as a Y direction.

The substrate 20 includes the substrate part 21 that is formed by stacking a plurality of substrate sheets, and the inner conductors 22 that are provided inside and on the surfaces of the substrate 20. The inner conductors 22 are conductors that electrically connect the acoustic wave device AD, the passive device PD, and the capacitor element C11 of the hybrid filter device 1 to one another. The inner conductors 22 are formed of in-plane conductors and interlayer conductors. The inner conductors 22 are formed of a metal material having copper as a main constituent, for example. The substrate 20 is shaped like a thin board, and the thickness of the substrate 20 is appropriately chosen from a range from 0.1 mm to 0.2 mm, for example. The substrate 20 is a substrate containing a ceramic material, but may be a flexible substrate containing a resin material or may be a printed circuit board.

The input/output terminals 91 and 92 are provided on the other main surface 20b side of the substrate 20. The input/output terminals 91 and 92 are connected to the acoustic wave device AD, the passive device PD, or the capacitor element C11 via the inner conductors 22. The input/output terminals 91 and 92 are columnar conductors and are formed so as to penetrate through the sealing resin layer 32 in the thickness direction (Z direction). Specifically, one end of each of the input/output terminals 91 and 92 abuts against the other main surface 20b of the substrate 20 and the other ends of the input/output terminals 91 and 92 are exposed at the main surface 32b of the sealing resin layer 32. When the hybrid filter device 1 is mounted on a mother substrate, the hybrid filter device 1 is bonded to the mother substrate by applying solder to the exposed parts of the input/output terminals 91 and 92. A plurality of ground terminals, which are different from the input/output terminals 91 and 92, are provided on the other main surface 20b side of the substrate 20 (not illustrated).

The capacitor element C11 is for example a surface mount device such as multilayer ceramic capacitor. The capacitor element C11 has a plurality of lead out terminals 53. The lead out terminals 53 of the capacitor element C11 are bonded to the one main surface 20a of the substrate 20 with solder. In addition, the capacitor element C11 is connected to the passive device PD via the inner conductors 22 provided so as to penetrate through the substrate 20. In addition, circuit elements other than the capacitor element C11 (for example, a capacitor element C12) may be formed inside the substrate 20.

The acoustic wave device AD includes the acoustic wave resonators P11, P12, S11, and S12. The acoustic wave resonators P11 and P12 are electrically connected to the inductor element L12 and form the filter circuit 12 together with the inductor element L12. The acoustic wave resonators S11 and S12 are electrically connected to the inductor element L13 and form the filter circuit 13 together with the inductor element L13. The acoustic wave device AD has a rectangular parallelepiped outer shape and has a plurality of lead out terminals 51 on the bottom surface thereof. The lead out terminals 51 of the acoustic wave device AD are bonded to the one main surface 20a of the substrate 20 by bumps 40, which consist of a bonding material. The acoustic wave resonators P11, P12, S11, and S12 are for example SAW resonators that each include an interdigital transducer (IDT) electrode. A compact low-profile acoustic wave device AD having a high-steepness bandpass characteristic can be formed by forming the acoustic wave resonators P11, P12, S11, and S12 using IDT electrodes.

The passive device PD is an integrated passive device (IPD) that includes a plurality of inductor elements L11, L12, and L13. The passive device PD has a rectangular parallelepiped outer shape and has a plurality of lead out terminals 52 on the bottom surface thereof. The lead out terminals 52 of the passive device PD are bonded to the other main surface 20b of the substrate 20 by bumps 40. The passive device PD has a structure in which a plurality of spiral-shaped coils are stacked in a vertical direction (Z direction) and is formed using thin film forming processes using photolithography techniques, for example. The inductor elements L12 and L13 of the passive device PD have higher Q values than for example a helical inductor formed inside the substrate 20 by inner conductors and have Q values that are greater than or equal to 20 at a frequency of 2 GHz and more preferably have Q values that are greater than or equal to 50 at a frequency of 2 GHz.

Figure 2B:
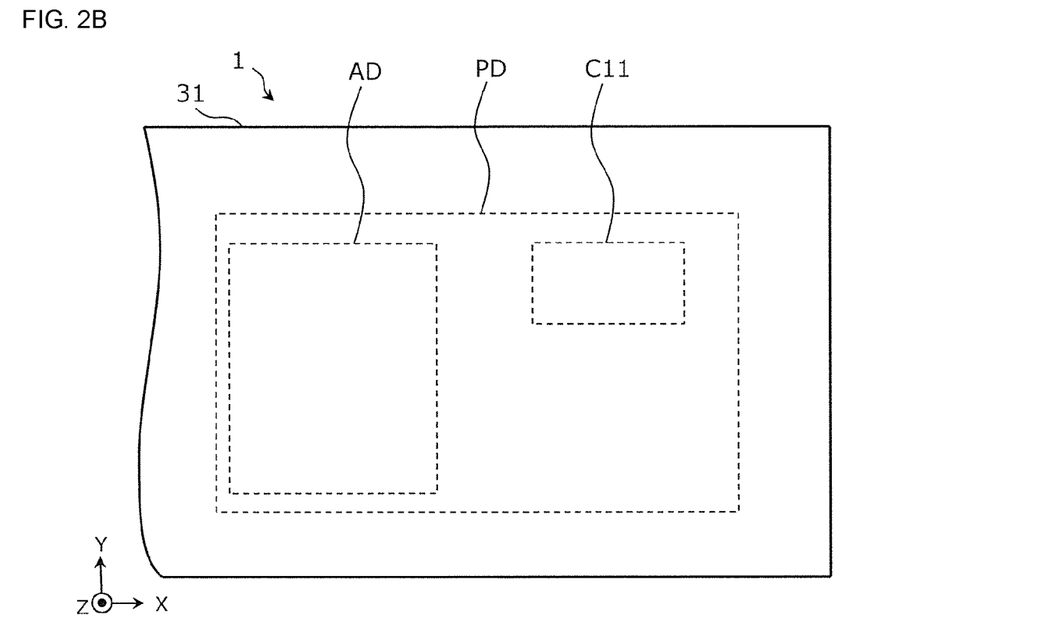
FIG. 2B is a plan view of the hybrid filter device according to embodiment 1.

In this embodiment, as illustrated in FIG. 2B, the acoustic wave device AD overlaps the passive device PD when the hybrid filter device 1 is viewed in a direction perpendicular to the one main surface 20a of the substrate 20 (in a plan view). Compared with a case where the acoustic wave device AD and the passive device PD are arranged side by side in a direction along the one main surface 20a (for example, X direction), the hybrid filter device 1 can be reduced in size by arranging the acoustic wave device AD and the passive device PD so as to overlap in a plan view in this way.

Furthermore, as illustrated in FIG. 2A, the acoustic wave device AD is connected to the passive device PD by a connection conductor 22a provided so as to extend in a direction perpendicular to the one main surface 20a of the substrate 20. The connection conductor 22a is part of the inner conductors 22 mentioned above. It is preferable that at least one of the plurality of lead out terminals 51 and at least one of the plurality of lead out terminals 52 be arranged so as to overlap in a plan view. In addition, it is preferable that the at least one lead out terminal 51 and the at least one lead out terminal 52 be connected to each other by the connection conductor 22a, which extends in a straight line.

By connecting the acoustic wave device AD and the passive device PD to each other using the connection conductor 22a that extends perpendicular to the one main surface 20a in this way, the length of a wiring line can be reduced compared with the case where the acoustic wave device AD and the passive device PD are arranged side by side on the one main surface 20a and connected to each other using a conductor. With this structure, wiring line loss can be reduced in the hybrid filter device 1. In addition, as a result of providing the connection conductor 22a so as to extend in a direction perpendicular to the one main surface 20a, for example, a parasitic capacitance generated between the connection conductor 22a and another inner conductor 22 provided parallel to the one main surface 20a can be suppressed.

In addition, although an example has been described in the above embodiment in which the acoustic wave device AD is mounted on the one main surface 20a of the substrate 20 and the passive device PD is mounted on the other main surface 20b of the substrate 20, the present disclosure is not limited to this configuration. For example, the hybrid filter device 1 may be configured such that the passive device PD is mounted on the one main surface 20a of the substrate 20 and the acoustic wave device AD is mounted on the other main surface 20b of the substrate 20.

In addition, although an example has been described in the above embodiment in which the acoustic wave resonators P11, P12, S11, and S12 are included in the acoustic wave device AD and the inductor elements L11, L12, and L13 are included in the passive device PD, the present disclosure is not limited to this configuration. For example, the acoustic wave resonators P11 and P12 may be included in one acoustic wave device and the acoustic wave resonators S11 and S12 may be included in another acoustic wave device. Furthermore, the inductor elements L11 and L12 may be included in one passive device and the inductor element L13 may be provided in another passive device.

Furthermore, the passive device PD is not limited to including inductor elements and may include switch elements. The present disclosure is not limited to a configuration in which the capacitor element C12 is formed inside the substrate 20, and inductor elements may also be formed inside the substrate 20 using the inner conductors 22. The acoustic wave device AD may include a piezoelectric substrate exhibiting piezoelectricity, an IDT electrode formed on the piezoelectric substrate exhibiting piezoelectricity, and a circuit element that is formed on the piezoelectric substrate exhibiting piezoelectricity and that forms an inductor or a capacitor. In other words, other than the acoustic wave resonators P11, P12, S11, and S12, for example, the inductor elements L11, L12, and L13, the capacitor element C11, and other different circuit elements may be formed inside the acoustic wave device AD. The inductor elements L11, L12, and L13, the capacitor element C11, and other different circuit elements may be directly formed on the piezoelectric substrate or may be formed on a resin cover layer provided so as to cover the piezoelectric substrate. The meaning of "formed on the piezoelectric substrate" includes a case where an element is formed so as to contact the piezoelectric substrate and a case where an element is formed above the piezoelectric substrate.

Embodiment 2

The structure of a hybrid filter device 1A of embodiment 2 will be described while referring to FIG. 3. The hybrid filter device 1A of embodiment 2 differs from the hybrid filter device 1 of embodiment 1 in that the hybrid filter device 1A has a one surface mounting structure and in that the passive device PD is built into the substrate 20.

Figure 3:
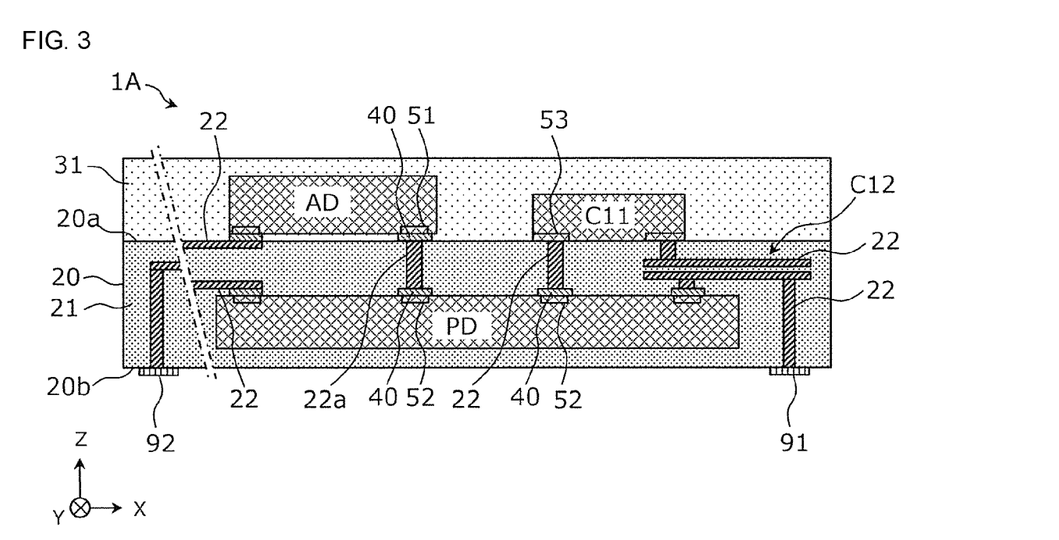
FIG. 3 is a sectional view of a hybrid filter device according to embodiment 2.

FIG. 3 is a sectional view of the hybrid filter device 1A. As illustrated in FIG. 3, the hybrid filter device 1A includes the substrate 20, the acoustic wave device AD and the capacitor element C11, which are mounted on the one main surface 20a of the substrate 20, and the passive device PD, which is buried inside the substrate 20.

The sealing resin layer 31 is provided on the one main surface 20a of the substrate 20 so as to cover the acoustic wave device AD and the capacitor element C11. The other main surface 20b of the substrate 20 is used as a mounting surface when mounting the hybrid filter device 1A on a mother substrate or the like.

The substrate 20 includes the substrate part 21 that is formed by stacking a plurality of substrate sheets, and the inner conductors 22 that are provided inside and on the surfaces of the substrate 20. The substrate 20 has a rectangular parallelepiped shape, and the thickness of the substrate 20 is appropriately chosen from a range from 0.3 mm to 1 mm, for example. The substrate 20 is a printed circuit board, for example. The input/output terminals 91 and 92 are provided on the other main surface 20b of the substrate 20.

The capacitor element C11 is bonded to the one main surface 20a of the substrate 20 using solder. The passive device PD is an integrated passive device including a plurality of inductor elements L11, L12, and L13. The acoustic wave resonators P11 and P12 of the acoustic wave device AD are electrically connected to the inductor element L12 and form the filter circuit 12 together with the inductor element L12. The acoustic wave resonators S11 and S12 are electrically connected to the inductor element L13 and form the filter circuit 13 together with the inductor element L13. A lead out terminal 51 of the acoustic wave device AD is connected to the corresponding lead out terminal 52 of the passive device PD via a bump 40 and the connection conductor 22a.

In this embodiment, the acoustic wave device AD overlaps the passive device PD when the hybrid filter device 1A is viewed in a direction perpendicular to the one main surface 20a of the substrate 20. Compared with a case where the acoustic wave device AD and the passive device PD are arranged side by side in a direction along the one main surface 20a (for example, X direction), the hybrid filter device 1A can be reduced in size by arranging the acoustic wave device AD and the passive device PD so as to overlap in a plan view in this way.

Furthermore, the acoustic wave device AD is connected to the passive device PD by the connection conductor 22a provided so as to extend in a direction perpendicular to the one main surface 20a of the substrate 20. It is preferable that at least one of the plurality of lead out terminals 51 and at least one of the plurality of lead out terminals 52 be arranged so as to overlap in a plan view. In addition, it is preferable that the at least one lead out terminal 51 and the at least one lead out terminal 52 be connected to each other by the connection conductor 22a, which extends in a straight line.

By connecting the acoustic wave device AD and the passive device PD to each other using the connection conductor 22a that extends perpendicular to the one main surface 20a in this way, the length of a wiring line can be reduced compared with a case where the acoustic wave device AD and the passive device PD are arranged side by side on the one main surface 20a and connected to each other with a conductor. With this structure, wiring line loss can be reduced in the hybrid filter device 1A.

In addition, although an example has been described in the above embodiment in which the passive device PD is buried inside the substrate 20, the present disclosure is not limited to this configuration. For example, the hybrid filter device 1A may have a configuration in which the acoustic wave device AD is buried inside the substrate 20 and the passive device PD is mounted on the one main surface 20a of the substrate 20.

In addition, the passive device PD may be arranged in an opposite posture in the vertical direction (Z direction). In this case, it is preferable that the lead out terminal 52 of the passive device PD and the lead out terminal 51 of the acoustic wave device AD be connected to each other via the inner conductors 22 of the substrate 20 and inner conductors provided inside the passive device PD.

Embodiment 3

The structure of a hybrid filter device 1B of embodiment 3 will be described while referring to FIG. 4. The hybrid filter device 1B of embodiment 3 differs from the hybrid filter device 1 of embodiment 1 in that the hybrid filter device 1B has a one surface mounting structure and in that two passive devices PDa and PDb are built into the substrate 20.

Figure 4:
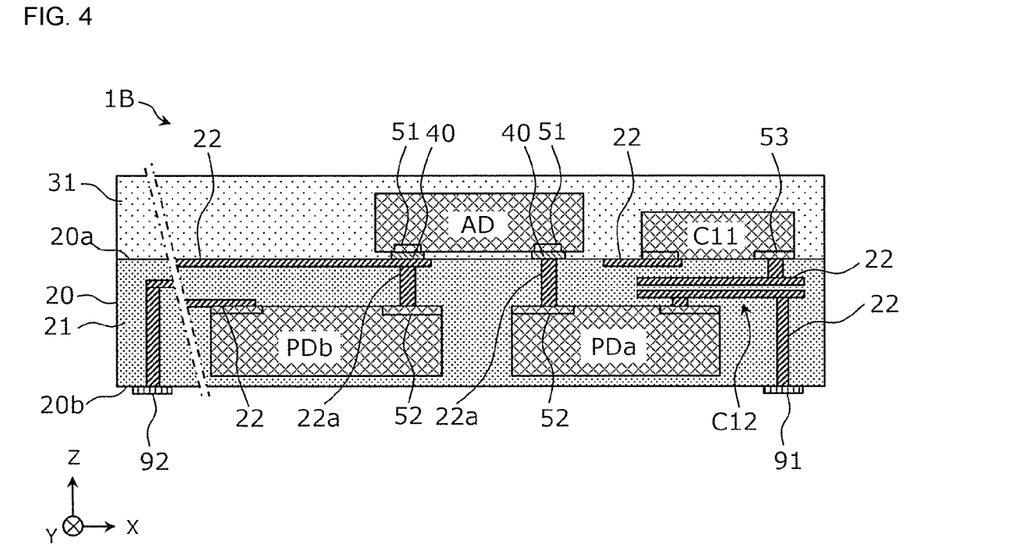
FIG. 4 is a sectional view of a hybrid filter device according to embodiment 3.

FIG. 4 is a sectional view of the hybrid filter device 1B. As illustrated in FIG. 4, the hybrid filter device 1B includes the substrate 20, the acoustic wave device AD and the capacitor element C11, which are mounted on the one main surface 20a of the substrate 20, and the passive devices PDa and PDb, which are buried inside the substrate 20.

For example, one passive device PDa among the two passive devices PDa and PDb includes the inductor elements L11 and L12 and the other passive device PDb includes the inductor element L13. The passive devices PDa and PDb are multilayer chip inductors or wound wire inductors. The inductor elements L11, L12, and L13 have higher Q values than for example a helical inductor formed inside the substrate 20 by inner conductors and have Q values that are greater than or equal to 20 at a frequency of 2 GHz and more preferably have Q values that are greater than or equal to 50 at a frequency of 2 GHz.

The acoustic wave resonators P11 and P12 of the acoustic wave device AD are electrically connected to the inductor element L12 and form the filter circuit 12 together with the inductor element L12. The acoustic wave resonators S11 and S12 of the acoustic wave device AD are electrically connected to the inductor element L13 and form the filter circuit 13 together with the inductor element L13. Lead out terminals 51 of the acoustic wave device AD are connected to the corresponding lead out terminals 52 of the passive devices PDa and PDb via the bumps 40 and connection conductors 22a.

In this embodiment, the acoustic wave device AD overlaps at least one of the passive devices PDa and PDb when the hybrid filter device 1B is viewed in a direction perpendicular to the one main surface 20a of the substrate 20. Specifically, the acoustic wave device AD overlaps part of the passive device PDa and part of the passive device PDb. Compared with a case where the acoustic wave device AD and the passive devices PDa and PDb are arranged side by side in a direction along the one main surface 20a (for example, X direction), the hybrid filter device 1B can be reduced in size by arranging the acoustic wave device AD and the passive devices PDa and PDb so as to overlap in a plan view in this way.

Furthermore, the acoustic wave device AD is connected to the passive devices PDa and PDb by the connection conductors 22a provided so as to extend in a direction perpendicular to the one main surface 20a of the substrate 20. It is preferable that at least one of the plurality of lead out terminals 51 and at least one of the plurality of lead out terminals 52 be arranged so as to overlap in a plan view. In addition, it is preferable that the at least one lead out terminal 51 and the at least one lead out terminal 52 be connected to each other by the connection conductor 22a, which extends in a straight line.

By connecting the acoustic wave device AD and the passive devices PDa and PDb to each other using the connection conductors 22a that extend perpendicular to the one main surface 20a in this way, the length of wiring lines can be reduced compared with a case where the acoustic wave device AD and the passive devices PDa and PDb are arranged side by side on the one main surface 20a and connected to each other using conductors. With this structure, wiring line loss can be reduced in the hybrid filter device 1B.

In addition, although an example has been described in the above embodiment in which the passive devices PDa and PDb are buried inside the substrate 20, the present disclosure is not limited to this configuration. For example, the hybrid filter device 1B may have a configuration in which the acoustic wave device AD is buried inside the substrate 20 and the passive devices PDa and PDb are mounted on the one main surface 20a of the substrate 20.

Embodiment 4

The structure of a hybrid filter device 1C of embodiment 4 will be described while referring to FIG. 5. The hybrid filter device 1C of embodiment 4 differs from the hybrid filter device 1 of embodiment 1 in that the hybrid filter device 1C has a one surface mounting structure and in that the passive device PD is accommodated in a cavity 25 in the substrate 20.

Figure 5:
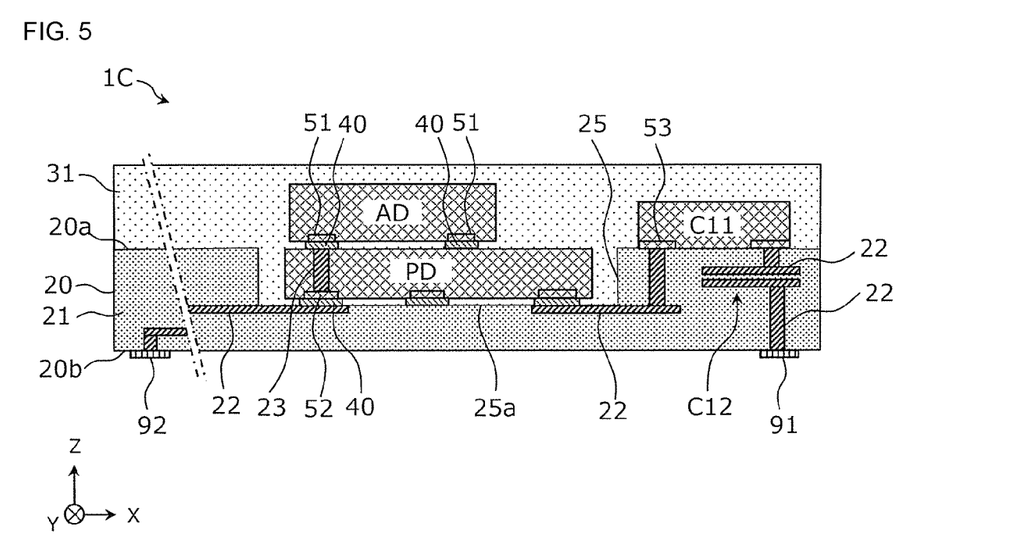
FIG. 5 is a sectional view of a hybrid filter device according to embodiment 4.

FIG. 5 is a sectional view of the hybrid filter device 1C. As illustrated in FIG. 5, the hybrid filter device 1C includes the substrate 20, the passive device PD, which is accommodated in the cavity 25 in the substrate 20, the acoustic wave device AD, which is bonded to the passive device PD, and the capacitor element C11, which is mounted on the one main surface 20a of the substrate 20. The sealing resin layer 31 is provided on the one main surface 20a of the substrate 20 so as to cover the passive device PD, the acoustic wave device AD, and the capacitor element C11.

The concave cavity 25 is provided in the one main surface 20a of the substrate 20. The cavity 25 has a rectangular shape in a plan view and is larger than the outer shapes of the passive device PD and the acoustic wave device AD. The lead out terminals 52 of the passive device PD are bonded to a bottom part 25a of the cavity 25. The acoustic wave device AD is stacked on top of the passive device PD. The lead out terminals 51 of the acoustic wave device AD are connected to the inductor elements L11, L12, and L13 or lead out terminals 52 of the passive device PD via a connection conductor 23 provided inside the passive device PD.

In this embodiment, the acoustic wave device AD overlaps the passive device PD when the hybrid filter device 1C is viewed in a direction perpendicular to the one main surface 20a of the substrate 20. Compared with a case where the acoustic wave device AD and the passive device PD are arranged side by side in a direction along the one main surface 20a (for example, X direction), the hybrid filter device 1C can be reduced in size by arranging the acoustic wave device AD and the passive device PD so as to overlap in a plan view in this way.

Furthermore, the acoustic wave device AD is connected to the inductor elements L11, L12, and L13 of the passive device PD by the connection conductor 23 provided inside the passive device PD. With this structure, the length of a wiring line can be reduced compared with for example a case where the acoustic wave device AD and the passive device PD are arranged side by side on the one main surface 20a and connected to each other using a conductor.

Although an example has been described in the above embodiment in which the passive device PD is mounted in the cavity 25 of the substrate 20 and the acoustic wave device AD is bonded to the top of the passive device PD, the present disclosure is not limited to this configuration. For example, the hybrid filter device 1C may have a configuration in which the acoustic wave device AD is mounted in the cavity 25 of the substrate 20 and the passive device PD is stacked on and bonded to the top of the acoustic wave device AD.

Embodiment 5

The structure of a hybrid filter device 1D of embodiment 5 will be described while referring to FIG. 6. The hybrid filter device 1D of embodiment 5 differs from the hybrid filter device 1 of embodiment 1 in that the hybrid filter device 1D has a one surface mounting structure and in that passive devices PDa and PDb are built into the substrate 20.

Figure 6:
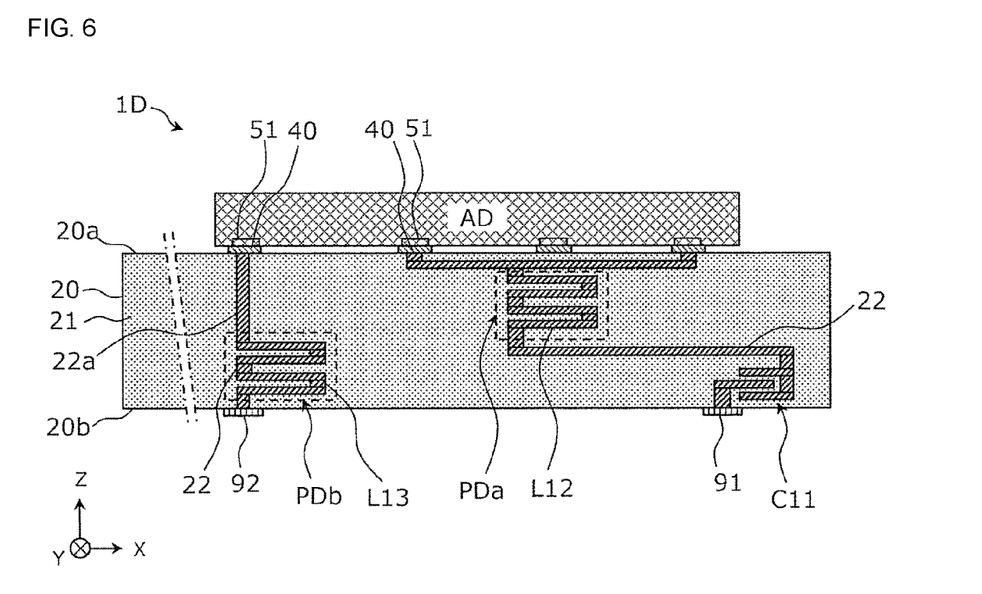
FIG. 6 is a sectional view of a hybrid filter device according to embodiment 5.

FIG. 6 is a sectional view of the hybrid filter device 1D. As illustrated in FIG. 6, the hybrid filter device 1D includes the substrate 20, the acoustic wave device AD, which is mounted on the one main surface 20a of the substrate 20, and the passive devices PDa and PDb and the capacitor element C11, which are buried inside the substrate 20. The sealing resin layer 31 is not provided on the one main surface 20a of the substrate 20 and the acoustic wave device AD is exposed.

The substrate 20 includes the substrate part 21 that is formed by stacking a plurality of substrate sheets, and the inner conductors 22 that are provided inside and on the surfaces of the substrate 20. The substrate 20 has a rectangular parallelepiped shape, and the thickness of the substrate 20 is appropriately chosen from a range from 0.1 mm to 1 mm, for example. The substrate 20 is a ceramic multilayer substrate, for example. The substrate 20 may be a flexible substrate containing a resin material or may be a printed circuit board.

The capacitor element C11 is formed inside the substrate 20. The passive device PDa is formed of the inductor element L12 formed by inner conductors 22 and the part of the substrate part 21 that covers the inductor element L12. The passive device PDb is formed of the inductor element L13 formed by inner conductors 22 and the part of the substrate part 21 that covers the inductor element L13. Illustration of the inductor element L11 is omitted from FIG. 6.

In this embodiment, the acoustic wave device AD overlaps the passive devices PDa and PDb when the hybrid filter device 1D is viewed in a direction perpendicular to the one main surface 20a of the substrate 20. Thus, the hybrid filter device 1D can be reduced in size by arranging the acoustic wave device AD and the passive devices PDa and PDb so as to overlap in a plan view.

Although an example in which the sealing resin layer 31 is not provided has been described in the above embodiment, the present disclosure is not limited to this configuration and the sealing resin layer 31 may be provided on the one main surface 20a of the substrate 20 so as to cover the acoustic wave device AD.

Embodiment 6

The structure of a hybrid filter device 1E of embodiment 6 will be described while referring to FIG. 7. The hybrid filter device 1E of embodiment 6 has a two surface mounting structure and differs from the hybrid filter device 1 of embodiment 1 in that two acoustic wave devices ADa and ADb are mounted on different main surfaces of the substrate 20. In addition, this embodiment differs from embodiment 1 in that two passive devices PDa and PDb are formed of passive devices including capacitance elements rather than inductor elements.

Figure 7:
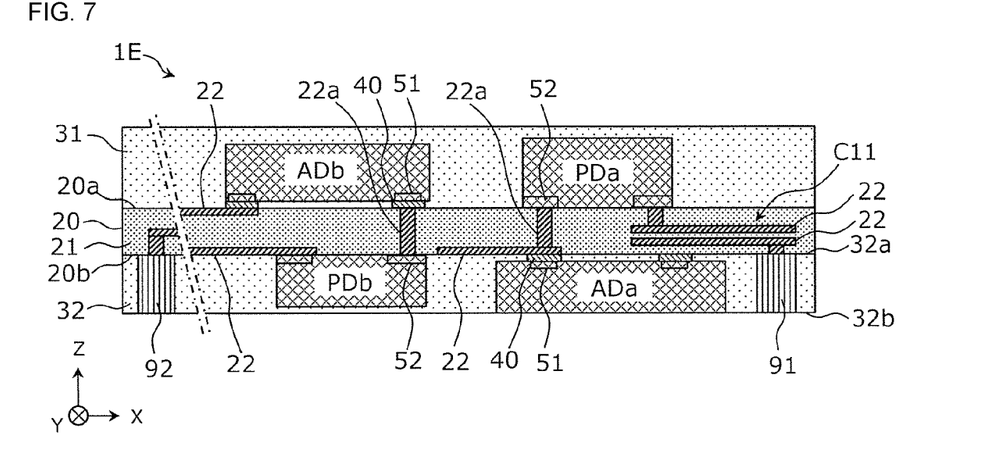
FIG. 7 is a sectional view of a hybrid filter device according to embodiment 6.

FIG. 7 is a sectional view of the hybrid filter device 1E. As illustrated in FIG. 7, the hybrid filter device 1E includes the substrate 20, the acoustic wave device ADb and the passive device PDa, which are mounted on the one main surface 20a of the substrate 20, and the acoustic wave device ADa and the passive device PDb, which are mounted on the other main surface 20b of the substrate 20.

The capacitor element C11 is formed inside the substrate 20 using the inner conductors 22. The passive device PDa includes a capacitance element and the passive device PDb includes a capacitance element. The passive devices PDa and PDb in this embodiment are multilayer chip capacitors, for example.

The acoustic wave device ADa includes the acoustic wave resonators P11 and P12 and the acoustic wave device ADb includes the acoustic wave resonators S11 and S12. A lead out terminal 51 of the acoustic wave device ADa is connected to a lead out terminal 52 of the passive device PDa via a bump 40 and the connection conductor 22a. A lead out terminal 51 of the acoustic wave device ADb is connected to a lead out terminal 52 of the passive device PDb via a bump 40 and the connection conductor 22a.

In this embodiment, the acoustic wave device ADb overlaps the passive device PDb and the acoustic wave device ADa overlaps the passive device PDa when the hybrid filter device 1E is viewed in a direction perpendicular to the one main surface 20a of the substrate 20. Thus, the hybrid filter device 1E can be reduced in size by arranging the acoustic wave device ADb and the passive device PDb and the acoustic wave device ADa and the passive device PDa so as to overlap in a plan view.

Furthermore, the acoustic wave device ADb is connected to the passive devices PDb by the connection conductor 22a provided so as to extend in a direction perpendicular to the one main surface 20a of the substrate 20. Furthermore, the acoustic wave device ADa is connected to the passive device PDa by the connection conductor 22a provided so as to extend in a direction perpendicular to the one main surface 20a. With this structure, the lengths of wiring lines can be reduced and wiring line loss can be reduced in the hybrid filter device 1E.

Embodiment 7

In embodiments 7 and 8, a multiplexer will be described that includes a plurality of filters including at least one of the hybrid filter devices 1 to 1E described in embodiments 1 to 6 and in which the input terminals or output terminals of the plurality of filters are directly or indirectly connected to a common terminal. For example, the multiplexer is a diplexer in the case where the plurality of filters consists of two filters, a triplexer in the case where the plurality of filters consists of three filters, and a quadplexer in the case where the plurality of filters consists of four filters. In addition, the plurality of filters may consist of five or more filters.

It is sufficient that at least one filter of the plurality of filters in the multiplexer consist of any one of the hybrid filter devices 1 to 1E according to embodiments 1 to 6, and the filters other than that one filter may consist of LC filter devices, acoustic wave filter devices, or any one of the hybrid filter devices 1 to 1E.

A multiplexer (diplexer) 101 that simultaneously transmits and receives signals of a plurality of frequency bands will be described while referring to FIG. 8.

Figure 8:
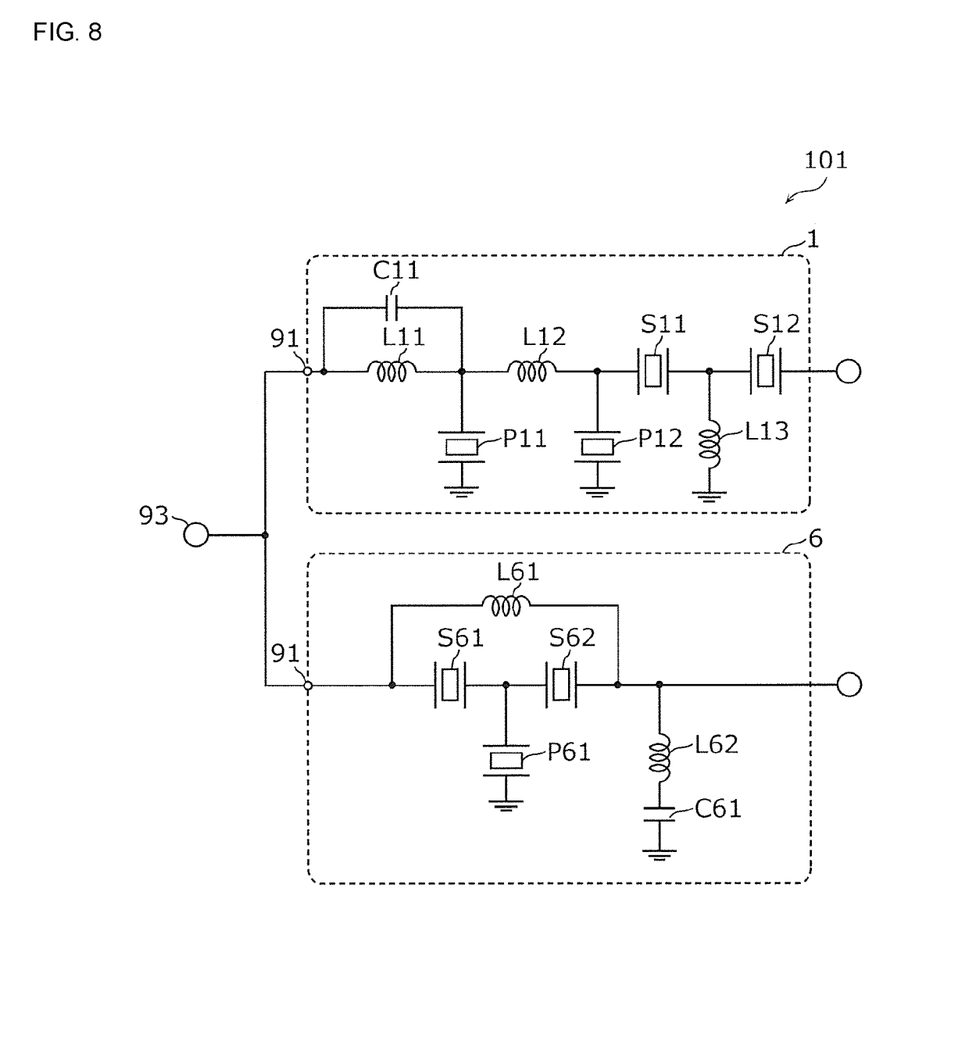
FIG. 8 is a circuit configuration diagram of a multiplexer according to embodiment 7.

FIG. 8 is a circuit configuration diagram of the multiplexer 101 according to embodiment 7.

The multiplexer 101 includes the hybrid filter device 1 according to embodiment 1 and a hybrid filter device 6, and input/output terminals 91 of the hybrid filter devices are connected to a common terminal 93.

As described in embodiment 1, the hybrid filter device 1 has a pass band from 1427 to 2200 MHz, which is a band extending from a MLB to a MB, and a stop band from 2300 to 2690 MHz, which is a HB.

The hybrid filter device 6 includes inductor elements L61 and L62, a capacitor element C61, acoustic wave resonators S61 and S62, which are series arm elements, and an acoustic wave resonator P61, which is a parallel arm element. The hybrid filter device 6 has a pass band from 2300 to 2690 MHz, which is a HB.

Here, although the frequency of the pass band of the hybrid filter device 1 on the high-frequency side and the frequency of the pass band of the hybrid filter device 6 on the low-frequency side are close to each other, since the steepness of the attenuation slope on the high-frequency side of the pass band of the hybrid filter device 1 is high and the steepness of the attenuation slope on the low-frequency side of the pass band of the hybrid filter device 6 is high, the respective pass bands of the hybrid filter devices are unlikely to be affected by each other and the degradation of the bandpass characteristics of the pass bands of the hybrid filter devices 1 and 6 can be suppressed.

The thus-configured multiplexer 101 can simultaneously transmit and receive signals of a plurality of frequency bands respectively handled by a plurality of filters, i.e., can support so-called CA.

Embodiment 8

A multiplexer (triplexer) 102 that simultaneously transmits and receives signals of a plurality of frequency bands will be described while referring to FIG. 9.

Figure 9:
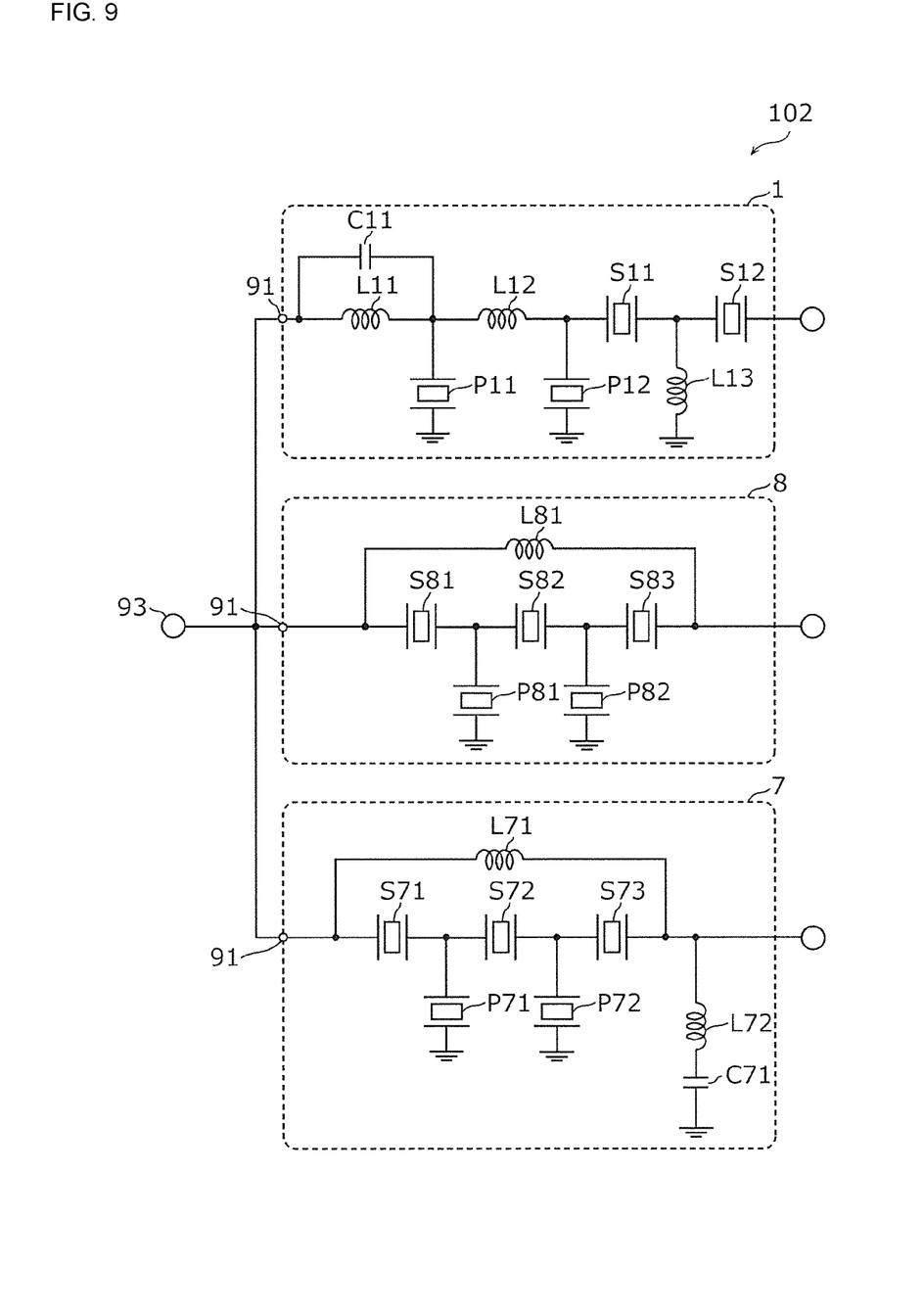
FIG. 9 is a circuit configuration diagram of a multiplexer according to embodiment 8.

FIG. 9 is a circuit configuration diagram of the multiplexer 102 according to embodiment 8.

The multiplexer 102 includes the hybrid filter device 1, a hybrid filter device 7, and a hybrid filter device 8 and input/output terminals 91 of the hybrid filter devices are connected to a common terminal 93.

As described in embodiment 1, the hybrid filter device 1 has a pass band from 1427 to 2200 MHz, which is a band extending from a MLB to a MB, and a stop band from 2300 to 2690 MHz, which is a HB.

The hybrid filter device 7 includes inductor elements L71 and L72, a capacitor element C71, acoustic wave resonators S71 to S73, which are series arm elements, and acoustic wave resonators P71 and P72, which are parallel arm elements. The hybrid filter device 7 has a pass band from 2496 to 2690 MHz, which is a HB2 included in the HB.

The hybrid filter device 8 includes the inductor element L81, the acoustic wave resonator S81 to S83, which are series arm elements, and the acoustic wave resonators P81 and P82, which are parallel arm elements. The hybrid filter device 8 differs from the hybrid filter device 7 in that the hybrid filter device 8 does not include the inductor element L72 and the capacitor element C71. The hybrid filter device 8 has a pass band from 2300 to 2400 MHz, which is a HB1 included in the HB.

Here, although the frequency of the pass band of the hybrid filter device 1 on the high-frequency side and the frequency of the pass band of the hybrid filter device 8 on the low-frequency side are close to each other, since the steepness of the attenuation slope on the high-frequency side of the pass band of the hybrid filter device 1 is high and the steepness of the attenuation slope on the low-frequency side of the pass band of the hybrid filter device 8 is high, the respective pass bands of the hybrid filter devices are unlikely to be affected by each other and the degradation of the bandpass characteristics of the pass bands of the hybrid filter devices 1 and 8 can be suppressed.

In addition, although the frequency of the pass band of the hybrid filter device 8 on the high-frequency side and the frequency of the pass band of the hybrid filter device 7 on the low-frequency side are close to each other, since the steepness of the attenuation slope on the high-frequency side of the pass band of the hybrid filter device 8 is high and the steepness of the attenuation slope on the low-frequency side of the pass band of the hybrid filter device 7 is high, the respective pass bands of the hybrid filter devices are unlikely to be affected by each other and the degradation of the bandpass characteristics of the pass bands of the hybrid filter devices 7 and 8 can be suppressed.

The thus-configured multiplexer 102 can simultaneously transmit and receive signals of a plurality of frequency bands respectively handled by a plurality of filters, i.e., can support so-called CA.

In addition, the multiplexer 102 may include an LPF connected to the common terminal 93. The LPF is for example formed of an LC circuit and the pass band of the LPF is for example from 600 to 960 MHz, which is an LB. In this case, the multiplexer 102 includes three filters consisting of a filter having a pass band from 600 MHz to 960 MHz, a filter having a pass band from 1427 MHz to 2200 MHz, and a filter having a pass band from 2300 MHz to 2690 MHz.

The thus-configured multiplexer 102 can simultaneously transmit and receive signals of a plurality of frequency bands respectively handled by a plurality of filters, i.e., can support so-called CA.

Furthermore, the multiplexer 102 may be a quadplexer and may further include an LPF connected to the common terminal 93 in addition to the hybrid filter devices 1, 7, and 8. The pass band of the LPF is for example from 600 to 960 MHz, which is a LB. In this case, the multiplexer 102 includes four filters consisting of a filter having a pass band from 600 MHz to 960 MHz, a filter having a pass band from 1427 MHz to 2200 MHz, a filter having a pass band from 2300 MHz to 2400 MHz, and a filter having a pass band from 2496 MHz to 2690 MHz.

The thus-configured multiplexer 102 can simultaneously transmit and receive signals of a plurality of frequency bands respectively handled by a plurality of filters, i.e., can support so-called CA.

Embodiment 9

Figure 10:
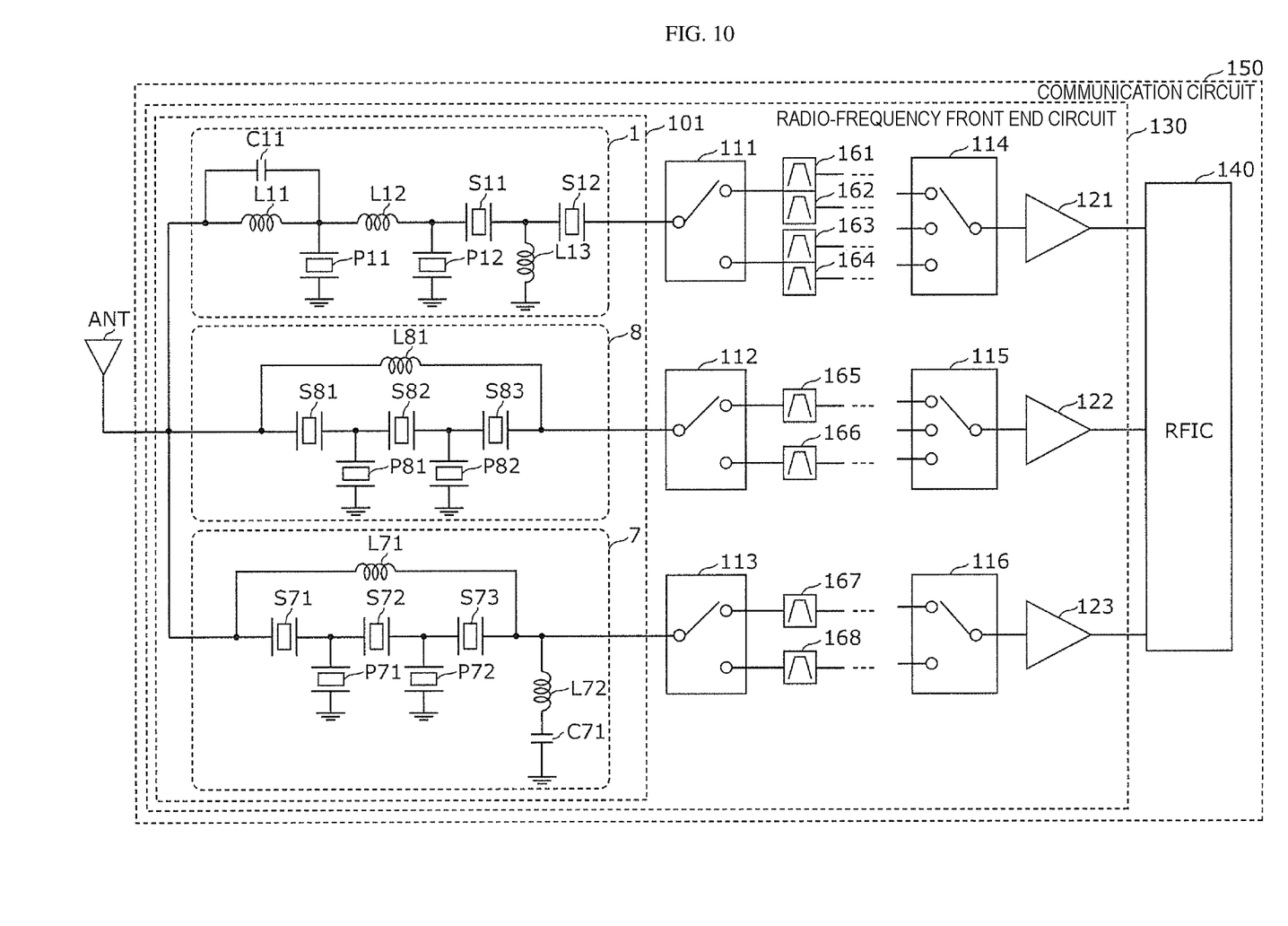
FIG. 10 is a circuit configuration diagram of a communication device according to embodiment 9.

The hybrid filter devices 1 to 1E and the multiplexers 101 and 102 described in embodiments 1 to 8 can be applied to a radio-frequency front end circuit and a communication device. Accordingly, such a high-frequency front end circuit and such a communication device will be described in embodiment 9. FIG. 10 is a circuit configuration diagram of a communication device 150 according to embodiment 9.

As illustrated in FIG. 10, the communication device 150 includes a radio-frequency front end circuit 130 and an RF signal integrated circuit (RFIC) 140. In addition, an antenna element ANT is illustrated in FIG. 10. The antenna element ANT is an antenna that transmits and receives radio-frequency signals and supports multiple bands in accordance with a communication standard such as LTE, for example. In addition, the antenna element ANT may be built into the communication device 150.

The radio-frequency front end circuit 130 is a circuit that transmits a radio-frequency signal between the antenna element ANT and the RFIC 140. Specifically, the radio-frequency front end circuit 130 transmits a radio-frequency signal received via the antenna element ANT (here, radio-frequency reception signal) to the RFIC 140 via a reception signal path.

The radio-frequency front end circuit 130 includes the multiplexer 102, switches 111 to 116, amplification circuits 121 to 123, and band pass filters (BPF) 161 to 168. The BPFs 161 and 162 and BPFs 163 and 164 form multiplexers. The multiplexer 102 for example supports CA as described in embodiment 8. The multiplexer of the radio-frequency front end circuit 130 is not limited to the multiplexer 102 and it is sufficient that the multiplexer be a multiplexer formed of a plurality of filters including at least one of the hybrid filter devices 1 to 1E according to embodiments 1 to 6.

The switches 111 to 113 are connected between the multiplexer 102 and the BPFs 161 to 168 and connect signal paths corresponding to a plurality of different bands (here, a band extending from MLB to MB, and HB1 and HB2) and the BPFs 161 to 168 to each other in accordance with a control signal from a control unit (not illustrated).

Specifically, a common terminal of the switch 111 is connected to the hybrid filter device 1 and selection terminals of the switch 111 are connected to the BPFs 161 to 164. A common terminal of the switch 112 is connected to the hybrid filter device 8 and selection terminals of the switch 112 are connected to the BPFs 165 and 166. A common terminal of the switch 113 is connected to the hybrid filter device 7 and selection terminals of the switch 113 are connected to the BPFs 167 and 168.

The switches 114 to 116 are connected between the amplification circuits 121 to 123 and the BPFs 161 to 168 and connect the BPFs 161 to 168 and the amplification circuits 121 to 123 to each other in accordance with a control signal from a control unit (not illustrated).

The pass band of the hybrid filter device 1 (1427 to 2200 MHz) is wider than the respective pass bands of the BPFs 161 to 164 and contains the pass bands of the BPFs 161 to 164. The pass band of the hybrid filter device 8 (2300 to 2400 MHz) contains the pass bands of the BPFs 165 and 166. The pass band of the hybrid filter device 7 (2496 MHz to 2690 MHz) contains the pass bands of the BPFs 167 and 168.

The amplification circuits 121 to 123 are for example low-noise amplifiers that are connected to the multiplexer 102 via the switches 111 to 116 and the BPFs 161 to 168 and that amplify a radio-frequency reception signal received via the antenna element ANT.

The RFIC 140 is an RF signal processing circuit that processes radio-frequency signals transmitted and received by the antenna element ANT. Specifically, the RFIC 140 performs signal processing using down conversion and so forth on a radio-frequency signal inputted from the antenna element ANT via a reception signal path of the radio-frequency front end circuit 130 (in this case, radio-frequency reception signal), and outputs a reception signal generated through this signal processing to a baseband signal processing circuit (not illustrated).

In the thus-configured communication device 150, a CA operation can be performed by for example switching the switches 111 to 113 to each select one band from among the bands that extends from MLB to MB (1427 to 2200 MHz), HB1 (2300 to 2400 MHz), and HB2 (2496 to 2690 MHz).

The radio-frequency front end circuit 130 may have a transmission signal path and may transmit a radio-frequency signal outputted from the RFIC 140 (in this case, a radio-frequency transmission signal) to the antenna element ANT via the transmission signal path. In this case, the RFIC 140 may perform signal processing using up conversion and so forth on a transmission signal inputted from the base band signal processing circuit and output a radio-frequency signal generated through this signal processing (in this case, a radio-frequency transmission signal) to the transmission signal path of the radio-frequency front end circuit 130. An amplification circuit 120 may be a power amplifier that amplifies the power of a radio-frequency transmission signal outputted from the RFIC 140.

The control unit mentioned above is not illustrated in FIG. 10 but may be included in the RFIC 140 or may be included in a switch IC together with a switch controlled by the control unit.

The thus-configured radio-frequency front end circuit 130 and communication device 150 are equipped with any of the hybrid filter devices 1 to 1E and 6 to 8 as described in embodiments 1 to 8 and as a result the radio-frequency front end circuit 130 and the communication device 150 can be reduced in size. In addition, a radio-frequency front end circuit and a communication device that can widen a frequency pass band increase the steepness of the attenuation slopes at the ends of the pass band can be realized.

SUMMARY

A hybrid filter device according to a mode of the present disclosure includes: a substrate; an acoustic wave device that includes an acoustic wave resonator; and a passive device that includes an inductor element or an inductor element and a capacitance element. At least one of the acoustic wave device and the passive device is mounted on the substrate. The acoustic wave device and the passive device are electrically connected to each other. The acoustic wave device overlaps the passive device when the hybrid filter device is viewed in a direction perpendicular to one main surface of the substrate.

With this configuration, the acoustic wave device and the passive device are arranged so as to overlap when viewed in a direction perpendicular to the one main surface of the substrate and consequently the hybrid filter device can be reduced in size compared with the case where the acoustic wave device and the passive device are arranged side by side in a direction along the one main surface of the substrate.

In addition, the acoustic wave device may be connected to the passive device using a connection conductor provided so as to extend in a direction perpendicular to the one main surface of the substrate.

By connecting the acoustic wave device and the passive device using a connection conductor that extends perpendicularly to the one main surface of the substrate in this manner, the length of a wiring line can be reduced compared with the case where the acoustic wave device and the passive device are arranged side by side on the one main surface and connected to each other using a conductor. With this structure, wiring line loss can be reduced in the hybrid filter device.

Furthermore, the acoustic wave device may be mounted on the one main surface or another main surface of the substrate and the passive device may be mounted on the one main surface or the other main surface on which the acoustic wave device is not mounted.

With this structure, the hybrid filter device can be reduced in size.

Furthermore, one of the acoustic wave device and the passive device may be mounted on the one main surface or the other main surface of the substrate and the acoustic wave device or the passive device that is not mounted on the one main surface or the other main surface may be buried in the substrate.

With this structure, the hybrid filter device can be reduced in size.

In addition, the substrate may have a concave cavity in the one main surface of the substrate and the acoustic wave device and the passive device may be stacked on top of one another in a direction perpendicular to the one main surface of the substrate and the acoustic wave device or the passive device may be mounted on a bottom part of the cavity.

With this structure, the hybrid filter device can be reduced in size.

In addition, the acoustic wave device may be mounted on the one main surface or the other main surface of the substrate, an inductor element may be formed of an inner conductor provided inside the substrate and the inductor element may be buried in the substrate.

With this structure, the hybrid filter device can be reduced in size. In addition, the number of components can be reduced.

Furthermore, the inductor element may have a Q value greater than or equal to 20 at 2 GHz.

With this configuration, the insertion loss of the hybrid filter device can be reduced.

Furthermore, the passive device may be an integrated passive device that includes a plurality of inductor elements.

With this configuration, the Q value of an inductor can be increased, and the insertion loss of the hybrid filter device can be reduced.

In addition, the passive device may further include a switch element.

Furthermore, the passive device may be a multilayer chip inductor or a wound wire inductor.

With this configuration, the Q value of an inductor can be increased, and the insertion loss of the hybrid filter device can be reduced.

In addition, the acoustic wave device may include a substrate that exhibits piezoelectricity, an IDT electrode that is formed on the substrate, and a circuit element that is formed on the substrate and forms an inductor or capacitor.

Furthermore, the hybrid filter device may have a pass band including frequencies from 1427 MHz to 2200 MHz.

With this configuration, a hybrid filter device having a pass band including frequencies from 1427 MHz to 2200 MHz can be reduced in size.

In order to achieve the above-described object, a multiplexer according to a mode of the present disclosure is a multiplexer that simultaneously transmits and receives signals of a plurality of frequency bands and includes at least one of the above-described hybrid filter devices.

With this configuration, the multiplexer can be reduced in size.

Furthermore, the multiplexer may be a diplexer.

In addition, the diplexer may include a filter having a pass band including frequencies from 1427 MHz to 2200 MHz and a filter having a pass band including frequencies from 2300 to 2690 MHz and at least one of the two filters may be any one of the above-described hybrid filter devices.

In addition, the multiplexer may be a triplexer.

Furthermore, the triplexer may include a filter having a pass band including frequencies from 1427 MHz to 2200 MHz, a filter having a pass band including frequencies from 2300 MHz to 2400 MHz, and a filter having a pass band including frequencies from 2496 MHz to 2690 MHz, and at least one of the three filters may be any one of the above-described hybrid filter devices.

Furthermore, the triplexer may include a filter having a pass band including frequencies from 600 MHz to 960 MHz, a filter having a pass band including frequencies from 1427 MHz to 2200 MHz, and a filter having a pass band including frequencies from 2300 MHz to 2690 MHz, and at least one of the three filters may be any one of the above-described hybrid filter devices.

In addition, the multiplexer may be a quadplexer.

Furthermore, the quadplexer may include a filter having a pass band including frequencies from 600 MHz to 960 MHz, a filter having a pass band including frequencies from 1427 MHz to 2200 MHz, a filter having a pass band including frequencies from 2300 MHz to 2400 MHz, and a filter having a pass band including frequencies from 2496 MHz to 2690 MHz, and at least one of the four filters may be any one of the above-described hybrid filter devices.

Other Embodiments

Hybrid filter devices and multiplexers of the present disclosure have been described above, but the present disclosure is not limited to embodiments 1 to 9. Various modifications, as thought of by those skilled in the art, made to embodiments 1 to 9 and other embodiments formed by combining constituent elements of different embodiments may also be included in the scope of one or a plurality of modes of the present disclosure so long as the modifications and embodiments do not depart from the spirit of the present disclosure.

In addition, the hybrid filter devices 1 to 1E of this embodiment do not have to include the resonance circuit 11. It is sufficient that the hybrid filter devices 1 to 1E include at least one of the filter circuit 12 and the filter circuit 13.

For example, the acoustic wave device AD may be an acoustic wave device including an acoustic wave element used in an arbitrary frequency band, such as a frequency band from 500 MHz to 1500 MHz, out of a frequency band from 500 MHz to 6 GHz.

For example, the substrate of the acoustic wave device AD is a substrate exhibiting piezoelectricity at least at a surface thereof. For example, the substrate may have a piezoelectric thin film at the surface thereof, and may be formed of a multilayer body consisting of the piezoelectric thin film, a film having a different acoustic velocity, a support substrate, and so on. In addition, for example, the substrate may be a multilayer body consisting of a high-acoustic-velocity support substrate and a piezoelectric thin film formed on the high-acoustic-velocity support substrate, a multilayer body consisting of a high-acoustic-velocity support substrate, a low-acoustic-velocity film formed on the high-acoustic-velocity support substrate, and a piezoelectric thin film formed on the low-acoustic-velocity film, or a multilayer body consisting of a support substrate, a high-acoustic-velocity film formed on the support substrate, a low-acoustic-velocity film formed on the high-acoustic-velocity film, and a piezoelectric thin film formed on the low-acoustic-velocity film. The substrate may instead exhibit piezoelectricity throughout the entirety thereof.

The present disclosure can be widely applied to communication devices such as mobile phones as a miniaturized hybrid filter device or multiplexer.

1, 1A, 1B, 1C, 1D, 1E, 6, 7, 8 hybrid filter device
11 resonance circuit
12 filter circuit (LPF)
13 filter circuit (HPF)
20 substrate
20a one main surface
20b other main surface
21 substrate part
22 inner conductor
22a connection conductor
23 connection conductor
25 cavity
25a bottom part
31, 32 sealing resin layer
32a, 32b main surface
40 bump
51, 52, 53 lead out terminal
91, 92 input/output terminal
93 common terminal
101, 102 multiplexer
111, 112, 113, 114, 115, 116 switch
121, 122, 123 amplification circuit
130 radio-frequency front end circuit
140 RF signal processing circuit (RFIC)
150 communication device
AD, ADa, ADb acoustic wave device
ANT antenna element
C11, C12, C61, C71 capacitor element
PD, PDa, PDb passive device
L11, L12, L13, L61, L62, L71, L72 inductor element
P11, P12, P61, P71, P72 acoustic wave resonator
r1 path
S11, S12, S61, S62, S71, S72, S73 acoustic wave resonator

The invention claimed is:

1. A hybrid filter device comprising: a substrate; an acoustic wave device including an acoustic wave resonator; a first passive device including an inductor element or an inductor element and a capacitance element; and a plurality of ground terminals;
wherein the acoustic wave device is mounted on the one main surface or the other main surface of the substrate,
the first passive device is mounted on the one main surface or the other main surface on which the acoustic wave device is not mounted,
the acoustic wave device and the first passive device are electrically connected to each other,
the acoustic wave device overlaps the first passive device when the hybrid filter device is viewed in a direction perpendicular to one main surface of the substrate,
the plurality of ground terminals are provided on the other main surface of the substrate,
a second passive device is provided on the main surface of the substrate which the acoustic wave device is mounted, and
the second passive device overlaps the first passive device when viewed in a direction perpendicular to one main surface of the substrate.

2. A multiplexer simultaneously transmitting and receiving signals of a plurality of frequency bands, the multiplexer comprising:
the hybrid filter device according to claim 1.

3. The multiplexer according to claim 2,
wherein the multiplexer is a triplexer.

4. The multiplexer according to claim 3,
wherein the triplexer includes
a filter having a pass band including frequencies from 1427 MHz to 2200 MHz,
a filter having a pass band including frequencies from 2300 MHz to 2400 MHz, and
a filter having a pass band including frequencies from 2496 MHz to 2690 MHz, and
at least one of the filter having a pass band including frequencies from 1427 MHz to 2200 MHz, the filter having a pass band including frequencies from 2300 MHz to 2400 MHz and the filter having a pass band including frequencies from 2496 MHz to 2690 MHz is the hybrid filter device.

5. The multiplexer according to claim 3,
wherein the triplexer includes
a filter having a pass band including frequencies from 600 MHz to 960 MHz,
a filter having a pass band including frequencies from 1427 MHz to 2200 MHz, and
a filter having a pass band including frequencies from 2300 MHz to 2690 MHz, and
at least one of the filter having a pass band including frequencies from 600 MHz to 960 MHz, the filter having a pass band including frequencies from 1427 MHz to 2200 MHz and the filter having a pass band including frequencies from 2300 MHz to 2690 MHz is the hybrid filter device.

6. The multiplexer according to claim 2,
wherein the multiplexer is a diplexer.

7. The multiplexer according to claim 6,
wherein the diplexer includes
a filter having a pass band including frequencies from 1427 MHz to 2200 MHz and
a filter having a pass band including frequencies from 2300 to 2690 MHz, and
one or both of the filter having a pass band including frequencies from 1427 MHz to 2200 MHz and the filter having a pass band including frequencies from 2300 to 2690 MHz is the hybrid filter device.

8. The multiplexer according to claim 2,
wherein the multiplexer is a quadplexer.

9. The multiplexer according to claim 8,
wherein the quadplexer includes
a filter having a pass band including frequencies from 600 MHz to 960 MHz,
a filter having a pass band including frequencies from 1427 MHz to 2200 MHz,
a filter having a pass band including frequencies from 2300 MHz to 2400 MHz, and
a filter having a pass band including frequencies from 2496 MHz to 2690 MHz, and
at least one of the filter having a pass band including frequencies from 600 MHz to 960 MHz, the filter having a pass band including frequencies from 1427 MHz to 2200 MHz, the filter having a pass band including frequencies from 2300 MHz to 2400 MHz and the filter having a pass band including frequencies from 2496 MHz to 2690 MHz is the hybrid filter device.

10. The hybrid filter device according to claim 1, wherein the inductor element has a Q value greater than or equal to 20 at 2 GHz.

11. The hybrid filter device according to claim 10, wherein the first passive device is an integrated passive device including a plurality of inductor elements.

12. The hybrid filter device according to claim 10, wherein the first passive device is a multilayer chip inductor or a wound wire inductor.

13. The hybrid filter device according to claim 1, wherein the acoustic wave device is connected to the first passive device using a connection conductor provided so as to extend in a direction perpendicular to the one main surface of the substrate.

14. The hybrid filter device according to claim 1, wherein the first passive device further includes a switch element.

15. The hybrid filter device according to claim 1, wherein the acoustic wave device includes a piezoelectric substrate exhibiting piezoelectricity, an IDT electrode provided on the piezoelectric substrate, and a circuit element provided in or on the piezoelectric substrate and comprising an inductor or a capacitor.

16. The hybrid filter device according to claim 1, wherein the hybrid filter device has a pass band including frequencies from 1427 MHz to 2200 MHz.

* * * * *